United States Patent
Lee et al.

(10) Patent No.: US 6,211,047 B1
(45) Date of Patent: Apr. 3, 2001

(54) METHOD FOR FORMING CONTACT OF SEMICONDUCTOR DEVICE

(75) Inventors: Jung Hoon Lee; Bo Ryeong Wi, both of Seoul (KR)

(73) Assignee: Hyundai Electronics Industries Co., Ltd., Ichon (JP)

( * ) Notice: Subject to any disclaimer, the term of this patent is extended or adjusted under 35 U.S.C. 154(b) by 0 days.

(21) Appl. No.: 09/472,203

(22) Filed: Dec. 27, 1999

(30) Foreign Application Priority Data

Dec. 30, 1998 (KR) .................................................. 98-61995

(51) Int. Cl.[7] ..................... H01L 21/3205; H01L 21/425; H01L 21/4763; H01L 21/44
(52) U.S. Cl. ......................... 438/587; 438/533; 438/595; 438/624; 438/738
(58) Field of Search ...................................... 438/584, 533, 438/587, 588, 595, 598, 624, 737, 738, 586

(56) References Cited

U.S. PATENT DOCUMENTS

| | | |
|---|---|---|
| 5,460,993 | 10/1995 | Hsu et al. . |
| 5,641,698 | 6/1997 | Lin . |
| 5,935,875 | * 8/1999 | Lee ....................................... 438/737 |
| 5,998,249 | * 12/1999 | Liaw et al. ........................... 438/238 |
| 6,015,730 | * 1/2000 | Wang et al. .......................... 438/241 |
| 6,121,082 | * 9/2000 | Linliu et al. .......................... 438/253 |

\* cited by examiner

Primary Examiner—Trung Dang
Assistant Examiner—Brook Kebede
(74) Attorney, Agent, or Firm—Jacobson, Price, Holman & Stern, PLLC

(57) ABSTRACT

A method comprises the steps of forming a stack structure of a gate insulation film, a conductor layer for a gate electrode and a mask insulation film on both a cell part and on a peripheral circuit part of a semiconductor substrate; forming a gate stack structure by patterning the stack structure; forming a stack structure of first and second spacer insulation films on an entire upper surface of the gate stack structure; forming a spacer in which the first and second spacer insulation films are stacked one upon the other on a side wall of the gate stack structure, by anisotrophically etching portions of the stack structure of the first spacer insulation film and the second spacer insulation film of the peripheral circuit part, using a cell part mask which reveals the peripheral circuit part; forming an interlayer insulation film for flattening an entire upper surface of a resultant structure; and implementing a self-aligning contact process for revealing the cell part of the semiconductor substrate.

20 Claims, 4 Drawing Sheets

METHOD FOR FORMING CONTACT OF SEMICONDUCTOR DEVICE

BACKGROUND OF THE INVENTION

1. Field of the Invention

The present invention relates to a method for forming a self-aligning contact of a semiconductor device, and more particularly, the present invention relates to a method for forming a contact of a semiconductor device, which allows the contact to be formed without degrading properties of the semiconductor device, using a self-aligning contact (SAC) as being necessarily required in manufacturing a highly integrated semiconductor device.

2. Description of the Related Art

In an existing memory device manufacturing technology, spacers are formed at gate side walls of a cell part and a peripheral circuit part using only one kind of material.

The spacer which is formed on the gate side wall of the peripheral circuit part is considered as an element which determines properties of a transistor, and the spacer which is formed on the gate side wall of the cell part is considered as an element which determines a contact area, that is, a contact process margin, when implementing an SAC process.

Accordingly, in order to secure a sufficient contact area, a size of the spacer must be reduced. However, in this case, a punch-through property of the transistor which is formed on the peripheral circuit part, is deteriorated.

While not shown in the drawings, hereinafter, a method for forming a contact of a semiconductor device according to the prior art will be described in detail.

First, a device isolation film is formed on an inactive region of a semiconductor substrate, and a gate stack structure is formed on an active region of the semiconductor substrate.

At this time, the gate stack structure refers to a stack structure of a gate oxide film, a conductor layer for a gate electrode, and a mask oxide film.

Then, a spacer oxide film having predetermined thickness is formed on a side wall of the gate stack structure.

Thereafter, an interlayer insulating film for flattening an entire upper surface of the resultant structure is formed.

After that, a photoresist film pattern is formed on the interlayer film by exposing and developing processes which use a contact mask.

Then, a self-aligning contact etching process is implemented by using the photoresist film pattern as a mask.

However, the method for forming the self-aligning contact of a semiconductor device according to the prior art, constructed as mentioned above, suffer from defects as described below.

In the method for forming the self-aligning contact of a semiconductor device, spacer oxide films are formed simultaneously on the cell and the peripheral parts so that they become thin thereby to reduce a channel length of the transistor of the peripheral circuit part.

Due to the above factor, a punch-through property of the transistor is deteriorated, whereby properties and reliability of the semiconductor device are degraded, and it is difficult to achieve a high integration of the semiconductor device.

SUMMARY OF THE INVENTION

Accordingly, the present invention has been made in an effort to solve the problems occurring in the related art, and an objective of the present invention is to provide a method for forming a contact of a semiconductor device, by which a stack structure of a nitride film and an oxide film is formed on a side wall of a gate stack structure, thereby allowing a self-aligning contact process to be implemented without degrading properties of a cell part and a peripheral circuit part of the semiconductor device.

In accordance with one aspect, the present invention provides a method for forming a contact of a semiconductor device, comprising the steps of: forming a gate stack structure on cell and peripheral circuit parts of a semiconductor substrate; forming a stack structure of first and second spacer insulation films on an entire upper surface of the gate stack structure; forming a spacer in which the first spacer insulating film and the second spacer insulating film are stacked one upon the other, on a side wall of the gate stack structure, by anisotrophically etching portions of the stack structure of the first spacer insulation film and the second spacer insulation film of the peripheral circuit part, using a cell part mask which reveals the peripheral circuit part; forming an interlayer insulation film for flattening an entire upper surface of a resultant structure; and implementing a self-aligning contact process for revealing the cell part of the semiconductor substrate.

In accordance with another aspect, the present invention provides a method for forming a contact of a semiconductor device, comprising the steps of: forming a stack structure of a gate insulation film, a conductor layer for a gate electrode and a mask insulation film on a cell part and a peripheral circuit part of a semiconductor substrate; forming a gate stack structure by patterning the stack structure; forming a stack structure of first and second spacer insulation films on an entire upper surface of the gate stack structure; forming a spacer in which the first and second spacer insulation films are stacked one upon the other, on a side wall of the gate stack structure, by etching portions of the stack structure of the first spacer insulation film and the second spacer insulation film of the peripheral circuit part, using a cell part mask which reveals the peripheral circuit part; forming an interlayer insulation film for flattening an entire upper surface of a resultant structure; and implementing a self-aligning contact process by etching the interlayer insulation film, the second spacer insulation film and the first spacer insulation film, using a peripheral circuit part mask which reveals the cell part of the semiconductor substrate.

In accordance with another aspect, the present invention provides a method for forming a contact of a semiconductor device, comprising the steps of: forming a stack structure of a gate insulation film, a conductor layer for a gate electrode and a mask insulation film on a cell part and a peripheral circuit part of a semiconductor substrate; forming a gate stack structure by patterning the stack structure; forming a stack structure of a spacer nitride film by a LPCVD method and a spacer oxide film on an entire upper surface of the gate stack structure; forming a spacer in which the spacer nitride film and the spacer oxide film are stacked one upon the other, on a side wall of the gate stack structure, by etching portions of the stack structure of the spacer nitride film and the spacer oxide film of the peripheral circuit part, using a cell part mask which reveals the peripheral circuit part; forming an interlayer insulation film for flattening an entire upper surface of a resultant structure; and implementing a self-aligning contact process by etching the interlayer insulation film, the spacer nitride film and the spacer oxide film, using a peripheral circuit part mask which reveals the cell part of the semiconductor substrate.

BRIEF DESCRIPTION OF THE DRAWINGS

The above-mentioned objectives, and other features and advantages of the present invention will become more apparent after reading the following detailed description when taken in conjunction with the drawings, in which.

DETAILED DESCRIPTION OF PREFERRED EMBODIMENTS

Figure 1:
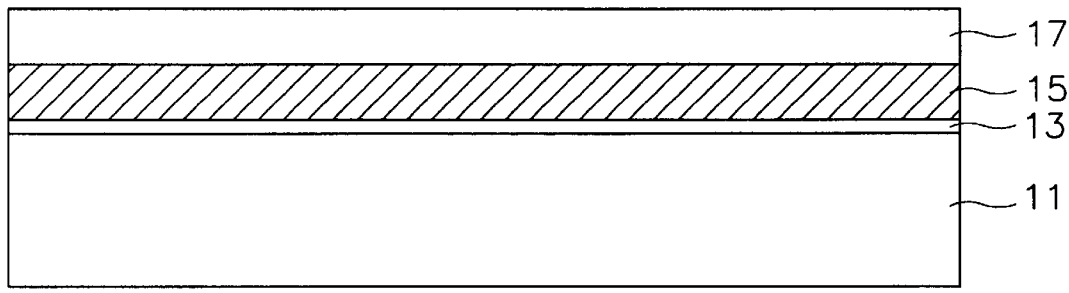
FIGS. 1 through 7 are cross-sectional views for explaining a method of forming a self-aligning contact of a semiconductor device, in accordance with an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 1 through 7 are cross-sectional views for explaining a method for forming a self-aligning contact of a semiconductor device, in accordance with an embodiment of the present invention.

In the contact forming method according to the present invention, first, a trench-type device isolation film (not shown) is formed on an inactive region of a semiconductor substrate 11 which is made of silicon.

Then, as shown in FIG. 1, a stack structure of a gate oxide film 13, a conductor layer 15 for a gate electrode and a mask oxide film 17 are formed on an entire upper surface including an active region of the semiconductor substrate 11.

At this time, the conductor layer 15 for a gate electrode may be made of silicon or formed as a metal layer, or may have a stack structure of silicon and a metal layer.

Figure 2:
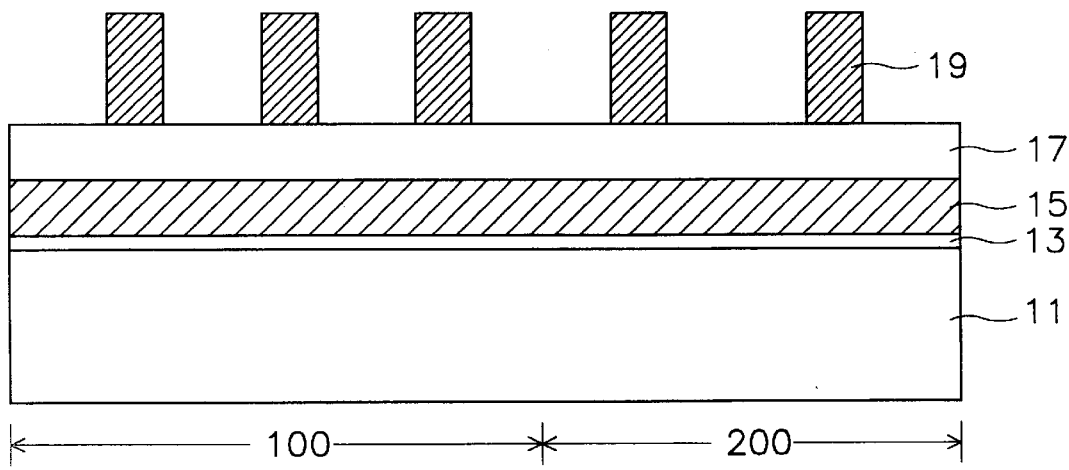

Thereafter, as shown in FIG. 2, a first photoresist film pattern 19 is formed on the mask oxide film 17.

At this time, the first photoresist film pattern 19 is formed by exposing and developing processes using a gate electrode mask (not shown).

Figure 3:
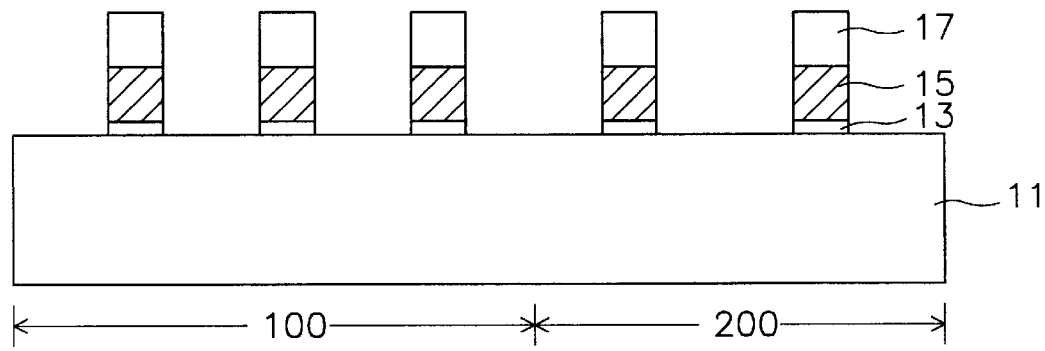

Then, as shown in FIG. 3, a gate stack structure is formed by etching the stack structure using the first photoresist film pattern 19 as a mask.

Figure 4:
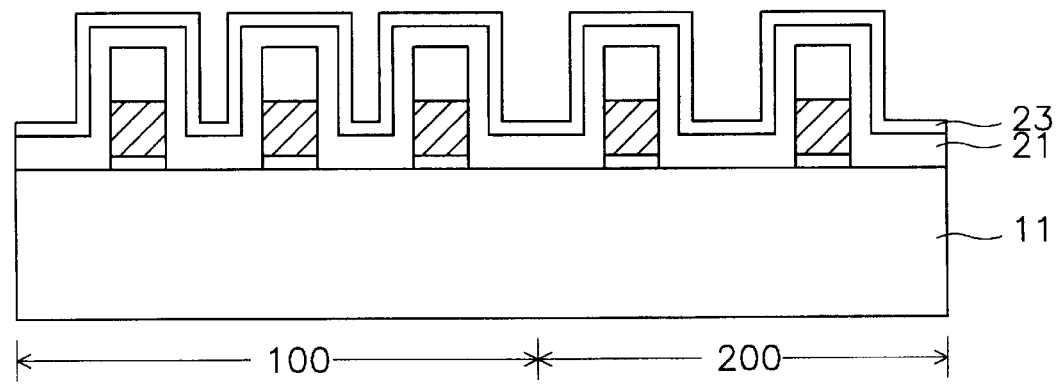

After that, as shown in FIG. 4, a stack structure of a spacer nitride film 21 and a spacer oxide film 23 is formed on an entire upper surface of the resultant structure which includes the gate stack structure.

Figure 5:
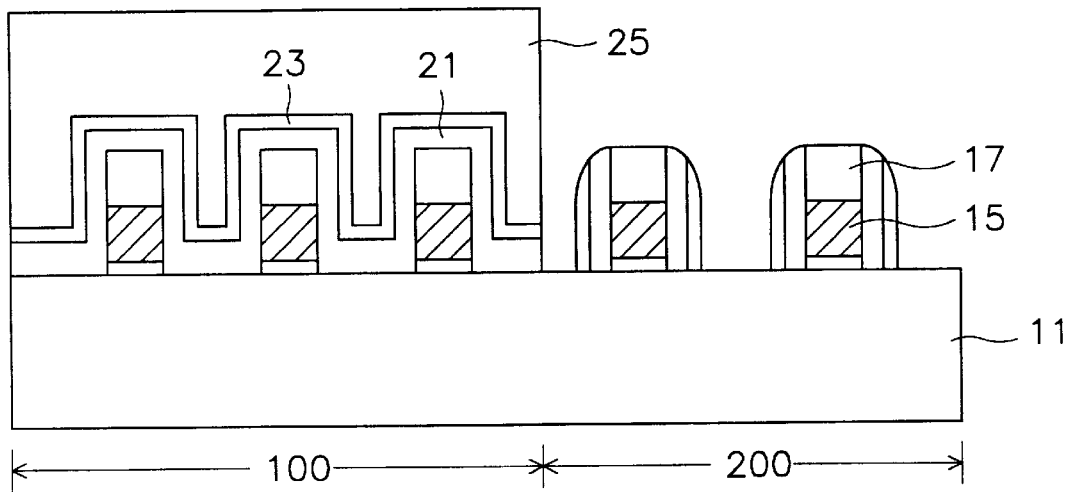

Thereafter, as shown in FIG. 5, a second photoresist film pattern 25 which covers only a cell part 100 and reveals a peripheral circuit part 200, is formed on the stack structure of the spacer nitride film 21 and the spacer oxide film 23.

At this time, the second photoresist film 25 pattern is formed by exposing and developing processes using a cell mask (not shown) which reveals the peripheral circuit part 200.

Following this, by anisotrophically etching the stack structure of the spacer nitride film 21 and the spacer oxide film 23 using the second photoresist film pattern 25 as a mask, a spacer of the stack structure of the spacer nitride film 21 and the spacer oxide film 23 is formed on a side wall of a transistor of the peripheral circuit part 200.

Here, the spacer nitride film 21 is formed by a LPCVD method because a nitride film formed by the LPCVD method is better than that formed by the PECVD method in an insulating characteristic.

Figure 6:
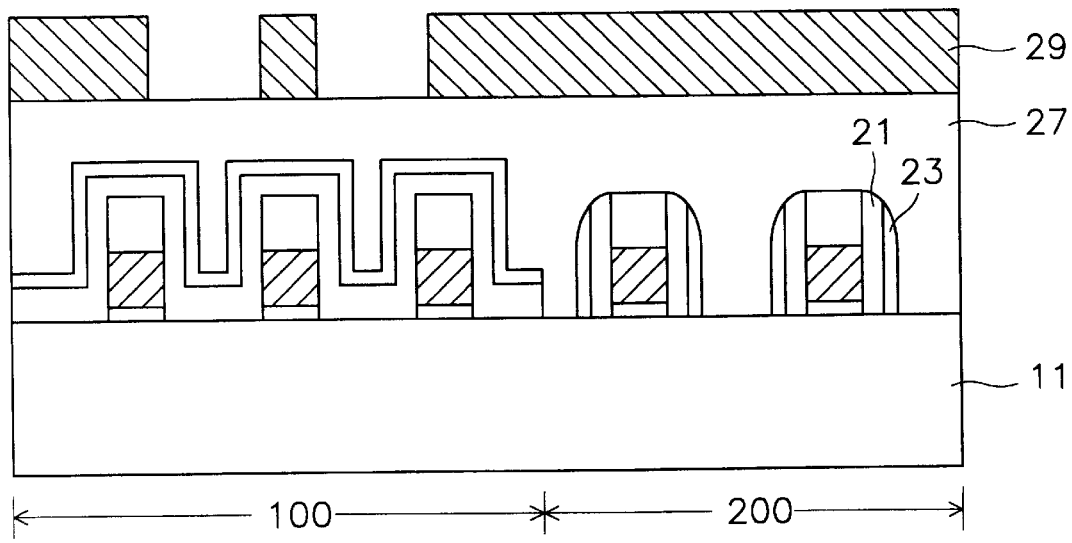

Then, as shown in FIG. 6, the second photoresist film pattern 25 is removed, and an interlayer insulation film 27 which flattens an entire upper surface of the resultant structure is formed.

At this time, the interlayer insulation film 27 is made of an insulating material such as borophosphossilicate glass (BPSG) which has an excellent flowability.

Thereafter, a third photoresist film pattern 29 is formed on the interlayer insulation film 27. At this time, the third photoresist film pattern 29 is formed by exposing and developing processes using a contact mask (not shown) which is employed for forming a contact hole on the cell part 100.

Figure 7:
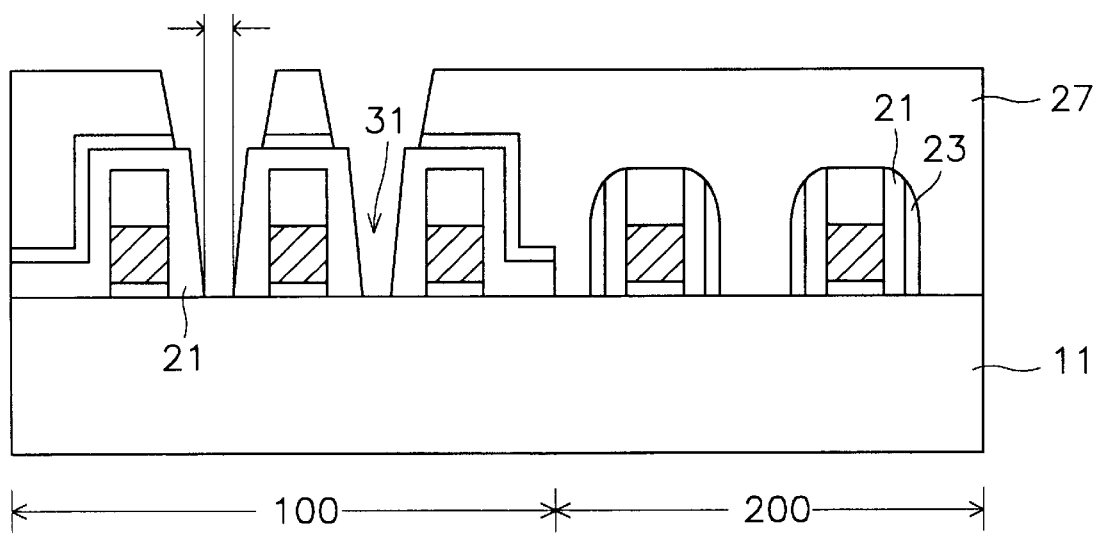

Then, as shown in FIG. 7, the contact hole 31 is formed on the cell part 100 of the semiconductor substrate 11 by a self-aligning contact (SAC) process which reveals the semiconductor substrate 11 while using the third photoresist film pattern 29 as a mask.

As a result, the side wall of the transistor which is revealed by implementing the SAC process on the cell part 100 is formed with the spacer nitride film 21, and the peripheral circuit part 200 is formed to have the stack structure of the spacer nitride film 21 and the spacer oxide film 23.

On the other hand, in accordance with another embodiment of the present invention, the spacer provided on the side wall of the transistor may be formed to have a stack structure of an oxide film, a nitride film and an oxide film.

As described above, by the method for forming a self-aligning contact of a semiconductor device according to the present invention, its advantages are provided as mentioned below.

In the method for forming a self-aligning contact of a semiconductor device according to the present invention, due to the fact that a spacer is formed on a side wall of a gate stack structure thereby to have a stack structure of a nitride film and an oxide film, and the nitride film which is different in an etch selection ratio from the interlayer insulation film is provided at a cell part to the side wall of the gate stack structure, an SAC process can be easily implemented.

Also, because a spacer can be formed at a peripheral circuit part to have a stack structure of a nitride film and an oxide layer, properties of a transistor provided to the peripheral circuit part are prevented from being degraded.

In the drawings and specification, there have been disclosed typical preferred embodiments of the invention, and although specific terms are employed, they are used in a generic and descriptive sense only and not for purposes of limitation, the scope of the invention is being set forth in the following claims.

What is claimed is:

1. A method for forming a contact of a semiconductor device, comprising the steps of:

forming a gate stack structure on a cell part and a peripheral circuit part of a semiconductor substrate;

forming a stack structure of first and second spacer insulation films on an entire upper surface of the gate stack structure;

forming a spacer of a stacked structure of the first and second spacer insulation films on a side wall of the gate stack structure by anisotrophically etching portions of the stack structure of the first and second spacer insulation films of the peripheral circuit part, using a cell part mask which reveals the peripheral circuit part;

forming an interlayer insulation film for flattening an entire upper surface of a resultant structure; and implementing a self-aligning contact process for revealing the cell part of the semiconductor substrate.

2. A method as claimed in claim 1, wherein the first spacer insulation film is a nitride film.

3. A method as claimed in claim 2, wherein the nitride film is formed by a LPCVD method.

4. A method as claimed in claim 1, wherein the second spacer insulation film is an oxide film.

5. A method as claimed in claim 1, wherein the interlayer insulation film is made of an insulating material such as BPSG, which belongs to a series of oxide films which are similar to the second spacer insulation film.

6. A method as claimed in claim 1, wherein the stack structure of the first and second spacer insulation films is formed by a stack structure of an oxide film and a nitride film, a nitride film.

7. A method as claimed in claim 1, wherein the self-aligning contact process is implemented by anisotrophically etching the interlayer insulation film, the second spacer insulation film and the first spacer insulation film, using a mask of the peripheral circuit part.

8. A method as claimed in claim 1, wherein, at a portion of the cell part, only the second spacer insulation film is left, and, at the peripheral circuit part, both the first and second spacer insulation films are left.

9. A method as claimed in claim 1, wherein the first spacer insulation film and the second spacer insulation film are formed by using a material having a high difference of an etch selectivity rate.

10. A method for forming a contact of a semiconductor device, comprising the steps of:
    forming a stack structure of a gate insulation film, a conductor layer for a gate electrode and a mask insulation film on a cell part and a peripheral circuit part of a semiconductor substrate;
    forming a gate stack structure by patterning the stack structure;
    forming a stack structure of first and second spacer insulation films on an entire upper surface of the gate stack structure;
    forming a spacer in which the first and second spacer insulation films are stacked one upon the other on a side wall of the gate stack structure by etching portions of the stack structure of the first spacer insulation film and the second spacer insulation film of the peripheral circuit part, using a cell part mask which reveals the peripheral circuit part;
    forming an interlayer insulation film for flattening an entire upper surface of a resultant structure; and
    implementing a self-aligning contact process by etching the interlayer insulation film, the second spacer insulation film and the first spacer insulation film, using a peripheral circuit part mask which reveals the cell part of the semiconductor substrate.

11. A method as claimed in claim 10, wherein the first spacer insulation film is a nitride film.

12. A method as claimed in claim 11, wherein the nitride film is formed by LPCVD method.

13. A method as claimed in claim 10, wherein the second spacer insulation film is an oxide film.

14. A method as claimed in claim 10, wherein the interlayer insulation film is made of insulating material such as BPSG, which belongs to a series of oxide films which are similar to the second spacer insulation film.

15. A method as claimed in claim 10, wherein the stack structure of the first and second spacer insulation films is formed by a stack structure of an oxide film, a nitride film and an oxide film.

16. A method as claimed in claim 10, wherein the first spacer insulation film and the second spacer insulation film are formed by using a material having a high difference of a etch selectivity rate.

17. A method as claimed in claim 10, wherein the second spacer insulation film is only left at a portion of the cell part, and both the first and second spacer insulation films are left at the peripheral circuit part.

18. A method for forming a contact of a semiconductor device, comprising the steps of:
    forming a stack structure of a gate insulation film, a conductor layer for a gate electrode and a mask insulation film on a cell part and a peripheral circuit part of a semiconductor substrate;
    forming a gate stack structure by patterning the stack structure;
    forming a stack structure of a spacer nitride film by a LPCVD method and a spacer oxide film on an entire upper surface of the gate stack structure;
    forming a spacer in which the spacer nitride film and the spacer oxide film are stacked one upon the other on a side wall of the gate stack structure by etching portions of the stack structure of the spacer nitride film and the spacer oxide film of the peripheral circuit part, using a cell part mask which reveals the peripheral circuit part;
    forming an interlayer insulation film for flattening an entire upper surface of a resultant structure; and
    implementing a self-aligning contact process by etching the interlayer insulation film, the spacer nitride film and the spacer oxide film, using a peripheral circuit part mask which reveals the cell part of the semiconductor substrate.

19. A method as claimed in claim 18, wherein the interlayer insulation film is made or an insulating material such as BPSG, which belongs to a series of oxide films which are similar to the second spacer insulation film.

20. A method as claimed in claim 10, wherein the second spacer insulation film is only left at a portion of the cell part, and both the first and second spacer insulation films are left at the peripheral circuit part.

* * * * *